US009343301B2

(12) United States Patent
Harris et al.

(10) Patent No.: US 9,343,301 B2
(45) Date of Patent: May 17, 2016

(54) QUANTUM DOTS MADE USING PHOSPHINE

(71) Applicant: Nanoco Technologies, Ltd., Manchester (GB)

(72) Inventors: James Harris, Manchester (GB); Nigel Pickett, Manchester (GB); Abdur-Rehman Irshad, Lancashire (GB); Martin Davis, Cheshire (GB); Paul Glarvey, Cheshire (GB); Nathalie Gresty, Cheshire (GB); Heather Yates, Cheshire (GB)

(73) Assignee: Nanoco Technologies Ltd., Manchester (GB)

(*) Notice: Subject to any disclaimer, the term of this patent is extended or adjusted under 35 U.S.C. 154(b) by 0 days.

(21) Appl. No.: 14/207,084

(22) Filed: Mar. 12, 2014

(65) Prior Publication Data
US 2014/0370690 A1    Dec. 18, 2014

Related U.S. Application Data

(60) Provisional application No. 61/783,324, filed on Mar. 14, 2013.

(51) Int. Cl.
*H01L 21/02* (2006.01)
*C09K 11/02* (2006.01)
*C09K 11/70* (2006.01)

(52) U.S. Cl.
CPC .......... *H01L 21/02601* (2013.01); *C09K 11/02* (2013.01); *C09K 11/70* (2013.01); *H01L 21/02387* (2013.01); *H01L 21/02557* (2013.01); *H01L 21/02628* (2013.01)

(58) Field of Classification Search
CPC ..................................................... H01L 21/02
See application file for complete search history.

(56) References Cited

U.S. PATENT DOCUMENTS

| 7,588,828 | B2 | 9/2009 | Mushtaq et al. |
| 7,803,423 | B2 | 9/2010 | O'Brien et al. |
| 7,850,777 | B2 | 12/2010 | Peng et al. |
| 7,985,446 | B2 | 7/2011 | O'Brien et al. |
| 8,062,703 | B2 | 11/2011 | O'Brien et al. |
| 2007/0289491 | A1 | 12/2007 | Peng et al. |
| 2008/0160306 | A1 | 7/2008 | Mushtaq et al. |

FOREIGN PATENT DOCUMENTS

WO    2009016354 A1    2/2009

OTHER PUBLICATIONS

Murray, C.B. et al., "Synthesis and Characterization of Nearly Monodisperse CdE (E = S, Se, Te) Semiconductor Nanocrystallites", J. Am. Chem. Soc. (1993) 115 (19) pp. 8706-8715.
(Continued)

*Primary Examiner* — Alexander Ghyka
(74) *Attorney, Agent, or Firm* — Blank Rome LLP

(57) ABSTRACT

A process is disclosed for producing quantum dots (QDs) by reacting one or more core semiconductor precursors with phosphine in the presence of a molecular cluster compound. The core semiconductor precursor(s) provides elements that are incorporated into the QD core semiconductor material. The core semiconductor also incorporates phosphorus, which is provided by the phosphine. The phosphine may be provided to the reaction as a gas or may, alternatively, be provided as an adduct of another material.

15 Claims, 3 Drawing Sheets

(56) References Cited

OTHER PUBLICATIONS

P. K. Khanna et. al., "A novel synthesis of indium phosphide nanoparticles," Materials Letters, vol. 57, pp. 4617-4621, 2003.

Green, M. et al., "A novel metalorganic route for the direct and rapid synthesis of monodispersed quantum dots of indium phosphide", Chem. Commun., (1998), pp. 2459-2460.

Didchenko, R. et al., "Reactions of Phosphine with Trimethylindium", J. Inorg. Nucl. Chem., (1960), vol. 14, pp. 35-37.

Manasevit, H. M., 'Single-Crystal Gallium Arsenide on Insulating Substrates', Applied Physics Letters, (1968), vol. 12, No. 4, pp. 156-159.

Theodoropoulos, C. et al., "Kinetic and Transport Modeling of the Metallorganic Chemical Vapor Deposition of InP from Trimethylindium and Phosphine and Comparison with Experiments", J. Electrochem. Soc., (1995), vol. 142, No. 6, pp. 2086-2094.

Ando, H. et al., "Gas-source MBE growth of n-type InP using TEI, $PH_3$, and $Si_2H_6$", Journal of Crystal Growth, (1991), 59, 464-468.

Trentler, T. J. et al., "Solution-Liquid-Solid Growth of Indium Phosphide Fibers from Organometallic Precursors: Elucidation of Molecular and Nonmolecular Components of the Pathway", J. Am., Chem. Soc., (1997), 119, pp. 2172-2181.

Li, L. et al., "Economic Synthesis of High Quality InP Nanocrystals Using Calcium Phosphide as the Phosphorus Precursor", Chem. Mater., (2008), 20, 2621-2623.

Nedeljković, J. M. et al., "Growth of InP Nanostructures via Reaction of Indium Droplets with Phosphide Ions: Synthesis of InP Quantum Rods and $InP-TiO_2$ Composites", J. Am., Chem. Soc., (2004), 126, pp. 2632-2639.

van Weert, M. H. M. et al., "Zinc Incorporation via the Vapor-Liquid-Solid Mechanism Into InP Nanowires", J. Am. Soc., (2009), 131, pp. 4578-4579.

Chiaramonte, T. et al., "Kinetic Effects in InP Nanowire Growth and Stacking Fault Formation: The Role of Interface Roughening", Nano Letters, (2011), 11, pp. 1934-1940.

Reiss, P. J. et al., "Characterization of Semiconductor Nanowires Using Optical Tweezers", Nano Letters, (2011), 11, pp. 2375-2381.

Johansson, J. et al., "Size reduction of self assembled quantum dots by annealing", Applied Surface Science, (1998), 134, pp. 47-52.

Burford, N. et al., "New synthetic opportunities using Lewis acidic phosphines", J. Chem. Soc., Dalton Trans. (2002), pp. 4307-4315.

Manasevit, H. M. et al., "The Use of Metal-Organics in the Preparation of Semiconductor Materials I. Epitaxial Gallium-V Compounds", J. Electrochem. Soc., (1969), vol. 116, No. 12, pp. 1725-1732.

Moss, R. H., "Adducts in the Growth of III-V Compounds", Journal of Crystal Growth, (1984), 68, pp. 78-87.

Bradley, D. C. et al., "The Reversible Adduct Formation of Group III Trialkyls With Relatively Involatile Phosphines; X-Ray Crystal Structures of $(Me_3M)_2(Ph_2PCH_2)_2$ (M = Al, Ga, In) and $(Me_3Al)_3(Ph_2PCH_2CH_2)_2PPh$", Polyhedron (1988), vol. 7, No. 14, pp. 1289-1298.

Manasevit, H. M. et al., "The Use of Metalorganics in the Preparation of Semiconductor Materials V. The Formation of In-Group V Compounds and Alloys", Electrochem Society, (1973), vol. 120, No. 1, pp. 135-137.

QUANTUM DOTS MADE USING PHOSPHINE

FIELD OF THE INVENTION

The present invention relates to the preparation of semiconductor quantum dot nanoparticles using phosphine gas as a phosphorus precursor.

BACKGROUND

There has been substantial interest in the preparation and characterisation of particles of compound semiconductors having dimensions in the range 2-50 nm, often referred to as quantum dots (QDs) or nanocrystals. These materials exhibit size-tuneable electronic properties that can be exploited in many commercial applications such as optical and electronic devices, biological labelling, solar cells, catalysis, biological imaging, light-emitting diodes, general space lighting and both electroluminescence and photoluminescence displays, amongst many new and emerging applications. The most studied of semiconductor materials have been the chalcogenide II-VI (i.e. group 12-group 16) materials, such as ZnS, ZnSe, CdS, CdSe and CdTe. Most noticeably, CdSe has been greatly studied due to its optical tuneability over the visible region of the spectrum.

Two fundamental factors, both related to the size of the individual QDs, are responsible for their unique properties. The first is the large surface-to-volume ratio: as a particle becomes smaller, the ratio of the number of surface atoms to those in the interior increases. Thus, surface properties play an important role in the overall properties of the material. The second factor is that their electronic properties change as a function of particles size; their band gap increases as the size of the particles decreases. This effect is a consequence of the confinement, analogous to the 'electron in a box' phenomena of quantum mechanics. The electronic states of QDs exhibit discrete energy levels similar to those observed in atoms and molecules, rather than continuous bands, as observed in the corresponding bulk semiconductor material. For a QD, the electron and hole produced by absorption of electromagnetic radiation (i.e., absorption of a photon) with energy greater than the first excitonic transition, are closer together than in the corresponding macrocrystalline material. Consequently, the Coulombic interaction between the electron and hole leads to a narrow bandwidth emission that is dependent upon the particle size and composition. QDs have higher kinetic energy than the corresponding macrocrystalline material and, consequently, the first excitonic transition (band gap) increases in energy with decreasing particle diameter.

Single core semiconductor QDs, which consist of a single semiconductor material along with an outer organic passivating layer, as illustrated in FIGS. 1A and 1B, can have relatively low quantum efficiencies due to electron-hole recombination occurring at defects and dangling bonds situated on the QD surface which lead to non-radiative electron-hole recombinations. One method to eliminate defects and dangling bonds on the surface of the QD is to grow a second inorganic material (typically a material having a wider bandgap and small lattice mismatch compared to the core material) on the surface of the core particle. Such a multi-shell QD is referred to as a 'core/shell' QD. Core/shell particles separate carriers confined in the core from surface states that would otherwise act as non-radiative recombination centres. One example of a core/shell QD is a QD having a ZnS shell grown on the surface of a CdSe core to provide a CdSe/ZnS core/shell QD.

Another approach is to prepare a core/multi-shell structure having a core of a wide bandgap material, coated with a thin shell of narrower bandgap material, which is, in turn, coated with another wide bandgap layer. An example is CdS/HgS/CdS grown using a substitution of Hg for Cd on the surface of the core nanocrystal to deposit just a few monolayers of HgS. With such core/multi-shell QDs the electron-hole pair is confined to a single shell layer. In the CdS/HgS/CdS material, photo-excited carriers are confined in the HgS layer.

As mentioned above, the coordination about the final inorganic surface atoms in any core, core/shell or core/multi shell QD is incomplete. Highly reactive non-fully coordinated atoms 'dangling bonds' on the surface of the particle tend to cause the particles to agglomerate. This problem can be overcome by passivating (capping) the 'bare' surface atoms with protecting organic groups. The outer most layer of organic material (capping agent) helps to inhibit particle aggregation and also further protects the QDs from their surrounding chemical environment. The capping agent may also provide a chemical linkage to attach other inorganic, organic or biological materials to the QD. In many cases, the capping agent is the solvent in which the QD preparation is undertaken, and may be a Lewis base compound, or a Lewis base compound diluted in an inert solvent, such as a hydrocarbon, whereby there is a lone pair of electrons that are capable of donor type coordination to the surface of the QD.

Important issues concerning the synthesis of high quality semiconductor QDs are particle uniformity, size distribution, quantum efficiencies and for use in commercial applications their long-term chemical and photostability. Most of the more recent methods of QD synthesis are based on the 'nucleation and growth' method described by Murray, Norris and Bawendi (C. B. Murray, D. J. Norris, M. G. Bawendi, *J. Am. Chem. Soc.* 1993, 115, 8706), who used organometallic solutions of metal-alkyls ($R_2M$) where M=Cd, Zn, Te; R=Me, Et and tri-n-octylphosphine sulfide/selenide (TOPS/Se) dissolved in tri-n-octylphosphine (TOP). Those precursor solutions were injected into hot tri-n-octylphosphine oxide (TOPO) in the temperature range 120-400° C. to produce TOPO coated/capped semiconductor nanoparticles of II-VI material. The size of the particles is controlled by the temperature, capping agent, concentration of precursor used and the length of time at which the synthesis is undertaken, with larger particles being obtained at higher temperatures, higher precursor concentrations and prolonged reaction times. This organometallic route has advantages over other synthetic methods, including greater monodispersity and high particle crystallinity. As mentioned, many variations of this method have now appeared in the literature and routinely give good quality core and core-shell nanoparticles in terms of both monodispersity and quantum yield.

Single-source precursors have also proved useful in the synthesis of semiconductor QD materials of II-VI. Bis(dialkyldithio-/diselenocarbamato)cadmium(II)/zinc(II) compounds, $M(E_2CNR_2)_2$ (where M=Zn or Cd, E=S or Se and R=alkyl), have been used in a similar 'one-pot' synthetic procedure, which involved dissolving the precursor in tri-n-octylphosphine (TOP) followed by rapid injection into hot tri-n-octylphosphine oxide/tri-n-octylphosphine (TOPO/TOP) above 200° C.

Fundamentally, all of the above procedures rely on the principle of high temperature particle nucleation, followed by particle growth at a lower temperature. Moreover, to provide a monodispersed ensemble of nanoparticles in the 2-10 nm range there must be proper separation of the nanoparticle nucleation step from the nanoparticle growth step. In the methods discussed above, separation is achieved by rapid injection of a cooler solution of one or both precursors into a hotter coordinating solvent (containing the other precursor if otherwise not present), which initiates particle nucleation. The sudden addition of the cooler solution upon injection subsequently lowers the reaction temperature (the volume of solution added is typically about ⅓ of the total solution) and inhibits further nucleation. Particle growth (being a surface catalyzed process or via Ostwald ripening, depending on the precursors used) continues to occur at the lower temperature. Thus, nucleation and growth are separated, yielding a narrow nanoparticle size distribution. This method works well for small-scale synthesis, where one solution can be added rapidly to another while keeping a reasonably homogenous temperature throughout the reaction. However, on larger preparative scales, large volumes of solution are required to be rapidly injected into one another and significant temperature differentials can occur, leading to unacceptably large particle size distributions.

Applicant's commonly owned U.S. Pat. No. 7,588,828 (filed Sep. 10, 2007 and issued Sep. 15, 2009), U.S. Pat. No. 7,803,423 (filed Apr. 27, 2005 and issued Sep. 28, 2010), U.S. Pat. No. 7,985,446 (filed Aug. 11, 2010 and issued Jul. 26, 2011) and U.S. Pat. No. 8,062,703 (filed Aug. 10, 2010 and issued Nov. 22, 2011) the entire contents of which are incorporated herein, describe methods of producing large volumes of high quality monodisperse QDs. QD precursors are provided in the presence of a molecular cluster compound under conditions whereby the integrity of the molecular cluster is maintained and acts as a well-defined prefabricated seed or template to provide nucleation centres that react with the chemical precursors to produce high quality nanoparticles on a sufficiently large scale for industrial application.

It will be appreciated from the foregoing discussion that many of the nanoparticle materials that have been extensively studied to date incorporate cadmium ions. There are, however, many environmental problems associated with the use of cadmium and other heavy metals such as mercury and lead based materials and so there is a need to develop non-cadmium containing nanoparticle materials. In particular, it is desirable to produce non-cadmium containing quantum dots that exhibit similar monodispersities and size-tuneable photoluminescent spectra to current cadmium based materials. Commercial needs also dictate that such materials should be produced in high yields on a large-scale, as cheaply as possible.

Colloidal synthesis of InP nanoparticles is known in the prior art. Syntheses typically use tris(trimethylsilyl)phosphine ($(TMS)_3P$) as the phosphorus precursor and proceed via hot injection. Alternative approaches use single source precursors, for example, Green and O'Brien (M. Green, P. O'Brien, *Chem. Commun.*, 1998, 2459) use $LiP^tBu_2$ to form the single source precursor $In(P^tBu_2)$, which decomposes in 4-ethylpyridine to form InP. High temperatures are typically required for those reactions. If a single source precursor is used, that precursor must be synthesized, requiring time and effort.

The use of phosphine gas in the metallo-organic synthesis of InP semiconductors was first described in the 1960s by Didchenko et al. (R. Didchenko, J. E. Alix, R. H. Toeniskoetter, *J. Inorg. Nucl. Chem.*, 1960, 14, 35). That method involves reacting trimethylindium ($InMe_3$) with phosphine to form InP and methane. Since then, reactions between $InMe_3$ and $PH_3$ gases have been extensively used for the synthesis of InP semiconductor films by metallo-organic chemical vapour deposition (MOCVD) (H. M. Manasevit, *Appl. Phys. Lett.*, 1968, 12, 156), chemical beam epitaxy (CBE) (C. Theodoropoulos, N. K. Ingle, T. J. Mountziaris, Z. Y. Chen, P. L. Liu, G. Kioseoglou, A. Petrou, *J. Electrochem. Soc.*, 1995, 142, 2086), and gas-source molecular beam epitaxy (GSMBE) (H. Ando, N. Okamoto, A. Sandhu, T. Fujii, *J. Cryst. Growth*, 1991, 59, 431). Single crystal InP growth in solution from $^tBu_3In$ and phosphine gas is also documented in the prior art (T. J. Trentler, S. C. Goel, K. M. Hickman, A. M. Viano, M. Y. Chiang, A. M. Beatty, P. C. Gibbons, W. E. Buhro, *J. Am. Chem. Soc.*, 1997, 119, 2172). The use of phosphine gas in the synthesis of InP nanoparticles, however, is little documented in the prior art, though a few examples do exist.

$PH_3$ has been used in solution-based syntheses of InP nanoparticles, either using gaseous $PH_3$ or by generating it in situ. For example, Peng et al. report the use of phosphine gas dissolved in benzene to synthesise InP nanoparticles (See A. Peng, M. Hines, S. Perera, U.S. Pat. No. 7,850,777, issued 2010). In a typical synthesis, a cation precursor solution is produced by mixing $In(Ac)_3$ with oleic acid and octadecene (ODE) at 80-130° C. under vacuum, until a clear solution is obtained. A portion of the cation solution, stored under $N_2$ or Ar, is mixed with an equal quantity of ODE in a vessel in a glove box filled with $N_2$ or Ar. A solution of $PH_3$ in benzene is added, then the reaction vessel is capped and sealed at room temperature, before removing from the glove box. The vessel is connected to a nitrogen cylinder then the pressure is increased from 0 psi to 1000 psi. The pressurised vessel is then heated to 250° C. using a heating mantle; the pressure increases to ~1700 psi. After 30 minutes at 250° C. the heating mantle and nitrogen cylinder are removed to quench the reaction. The vessel is cooled to room temperature. Once cool, the pressure is released and acetone is added to the reaction solution until it turns turbid. The mixture is centrifuged, then the solid is re-dissolved in toluene and retained as the product.

Li et al. generate phosphine gas in situ by reacting calcium phosphide with hydrochloric acid to synthesise InP nanoparticles (L. Li, M. Protiere, P. Reiss, *Chem. Mater.*, 2008, 20, 2621). In a typical reaction, $In(Ac)_3$ and myristic acid are mixed with ODE under inert conditions, in a three-necked flask fitted with a condenser. A separate flask loaded with $Ca_3P_2$ is connected to a precursor flask, via a column containing $P_2O_5$ to eliminate any water from the generated $PH_3$. The In-precursor is heated to 100-120° C. until a clear solution is formed, then after degassing both flasks they are filled with Ar. After heating the In-precursor flask to 250° C., 4 M HCl is injected into the $Ca_3P_2$-containing flask; gaseous $PH_3$ is produced, which is carried via the Ar flow, then bubbled through the In-precursor flask to synthesise InP nanocrystals, characterised by a colour change from colourless to dark red. After 20 minutes, once all the $Ca_3P_2$ has been consumed, the reaction solution is cooled and the nanoparticles are mixed with an acetone/chloroform/methanol mixture, then isolated by centrifugation. As the phosphine gas is released slowly, nanoparticle growth is thought to take place in the size focusing regime, resulting in a narrow particle size distribution, thus a well-defined excitonic peak.

Nedeljković et al. report the synthesis of InP nanorods, using $PH_3$ generated in situ by the hydrolysis of tris(trimethylsilyl)phosphine ($(TMS)_3P$) (J. M. Nedeljković, O. I. Mićić, S. P. Ahrenkiel, A. Miedaner, A. J. Nozik, *J. Am. Chem. Soc.*, 2004, 126, 2632). In one example, 6.5 nm. In nanoparticles are synthesised at room temperature, by decomposing $C_5H_5In$ in toluene and a little trioctylamine, in the dark. A solution of the In nanoparticles is further diluted with toluene, which is then mixed with $(TMS)_3P$ in the presence of MeOH or thiophenol (PhSH); the alcohol or thiol hydrolyses the P—SiMe$_3$ bond to form $PH_3$. Upon mixing, nanowires form immediately. The solution is then heated to 220° C. for 2 minutes. A colour change to brown is observed as the InP nanowires form. The resulting nanowires are isolated by dilution in toluene, followed by precipitation with MeOH. The particles are cleaned by dissolving in 1% HDA in chloroform.

The use of $PH_3$ in the growth of InP by chemical vapour deposition (CVD), chemical beam epitaxy (CBE) and molecular beam epitaxy (MBE) has, more recently, been adapted to produce nanoparticles or nanowires. In contrast to the colloidally synthesised nanoparticles disclosed in the present disclosure, using CVD, CBE and MBE the nanoparticles are grown on a substrate, restricting their use to thin film applications.

InP nanowires doped with Zn or S have been grown by metal-organic vapour-phase epitaxy (MOVPE), a type of CVD, using $PH_3$ gas as the phosphorus source, as described by van Weert et al. (M. H. M. van Weert, A. Helman, W. van den Einden, R. E. Algra, M. A. Verheijen, M. T. Borgström, G. Immink, J. J. Kelly, L. P. Kouwenhoven, E. P. A. M. Bakkers, *J. Am. Chem. Soc.*, 2009, 131, 4578). The nanowires are grown via a vapour-liquid-solid mechanism, using catalytic 50 nm gold colloids deposited on a phosphorus-terminated InP substrate. $PH_3$ and $InMe_3$ gases are used as the P and In precursors, respectively, with diethylzinc being used to dope the resultant InP with Zn, and $H_2S$ for sulphur-doping. The resultant nanowires have diameters less than 100 nm, which can be further reduced by wet-chemical etching using $H_2SO_4/H_2O_2/H_2O$ to remove any competitive radial growth.

In an example of InP nanowires formation using CBE, Chiaramonte et al. use $InMe_3$ and $PH_3$ as the In and P sources, respectively (T. Chiaramonte, L. H. G. Tizei, D. Ugarte, M. A. Cotta, *Nano Lett.*, 2011, 11, 1934). The InP nanowires are grown on a GaAs (100) substrate in a CBE chamber, using 10 nm or 25 nm Au nanoparticle catalysts. $InMe_3$ diluted with an $H_2$ carrier gas, and $PH_3$ at a flow rate of 15 sccm, thermally decompose at the growth temperature of 420° C. to form wurtzite phase nanowires. The nanowires are cooled in a $PH_3$ atmosphere.

Reiss et al. describe the growth of InP nanowires by MOCVD, using $PH_3$ as the phosphorus source (P. J. Reiss, W. J. Toe, F. Wang, S. Paiman, Q. Gao, H. H. Tan, C. Jagadish, *Nano Lett.*, 2011, 11, 2375). Epitaxial growth takes place on an InP (111)B substrate, catalysed by 30 nm Au nanoparticles. The nanowires are grown in an MOCVD reactor, using $InMe_3$ and $PH_3$ precursors. Wurtzite phase nanowires predominate when the pressure is maintained at 100 mbar, at a growth temperature of 490° C., with a P/In ratio of 44 and a growth time of approximately 20 minutes.

$PH_3$ has been used in metal organic vapour phase epitaxy (MOVPE) to synthesise InP quantum dots on GaAs and $Ga_{0.5}In_{0.5}P$ surfaces, using Stranski-Krastanow growth (J. Johansson, W. Seifert, V. Zwiller, T. Junno, L. Samuelson, *Appl. Surf. Sci.*, 1998, 134, 47). In that method, 2D expitaxial layers of a material are initially deposited, but above a critical thickness the layers relax under compressive strain to form 3D islands or dots and a thinner 2D wetting layer. In one example, freestanding InP islands are grown on GaAs (001) substrates in an MOVPE reactor at 100 mbar. Two monolayers of GaP are grown using trimethylgallium ($GaMe_3$) and $PH_3$, to stabilise the GaAs surface. Three monolayers of InP are then deposited at a rate of 0.6 ML $s^{-1}$ at 600° C., using $InMe_3$ and $PH_3$ precursors. The samples are then annealed under a $PH_3/H_2$ atmosphere; during annealing the island height decreases from 19 nm to 7 nm over 30 minutes, thus the process can be used to tune the photoluminescence wavelength by altering the island height.

The methods to synthesise InP-based nanoparticles using $PH_3$ gas described in the prior art typically involve the use of high temperatures and/or pressures. CVD and chemical beam experiments require expensive equipment and the resultant nanoparticles are restricted to thin-film application. There is a need for methods for producing monodisperse, organically-capped QDs at relatively low temperature and without the need for high pressures.

SUMMARY

An aim of the present disclosure is to address one or more of the problems inherent in prior art methods for the production of QD materials. A further aim is to provide new non-cadmium containing QD materials, which satisfy one or more of the commercial needs set out above.

The current disclosure concerns III-V QDs and their alloyed derivatives grown colloidally using phosphine gas as the group V precursor. In addition, the QDs are grown on, and thereby incorporate, molecular clusters.

According to certain embodiments, the QDs include a molecular cluster compound incorporating ions from groups 12 and 16 of the periodic table, and a core semiconductor material provided on said molecular cluster compound, wherein the core semiconductor material incorporates ions from groups 13 and 15 of the periodic table.

The process for producing QDs involves reacting one or more core semiconductor precursors with phosphine in the presence of a molecular cluster compound. The core semiconductor precursor(s) provides some of the elements to be incorporated into the QD. The core semiconductor also comprises phosphorus, which is provided by the phosphine. The phosphine may be provided to the reaction as a gas or may, alternatively, be provided as an adduct of another material. The QDs may be simply a core of a single semiconductor material (disposed upon the molecular cluster compound). Alternatively, the QDs may include shells of additional semiconductor materials disposed upon the core semiconductor material. The present disclosure therefore provides a means by which III-V QDs can be produced relatively cheaply on a large-scale using phosphine gas.

DESCRIPTION OF THE DRAWINGS

The present disclosure includes drawings, in which.

DESCRIPTION

Figure 1A:
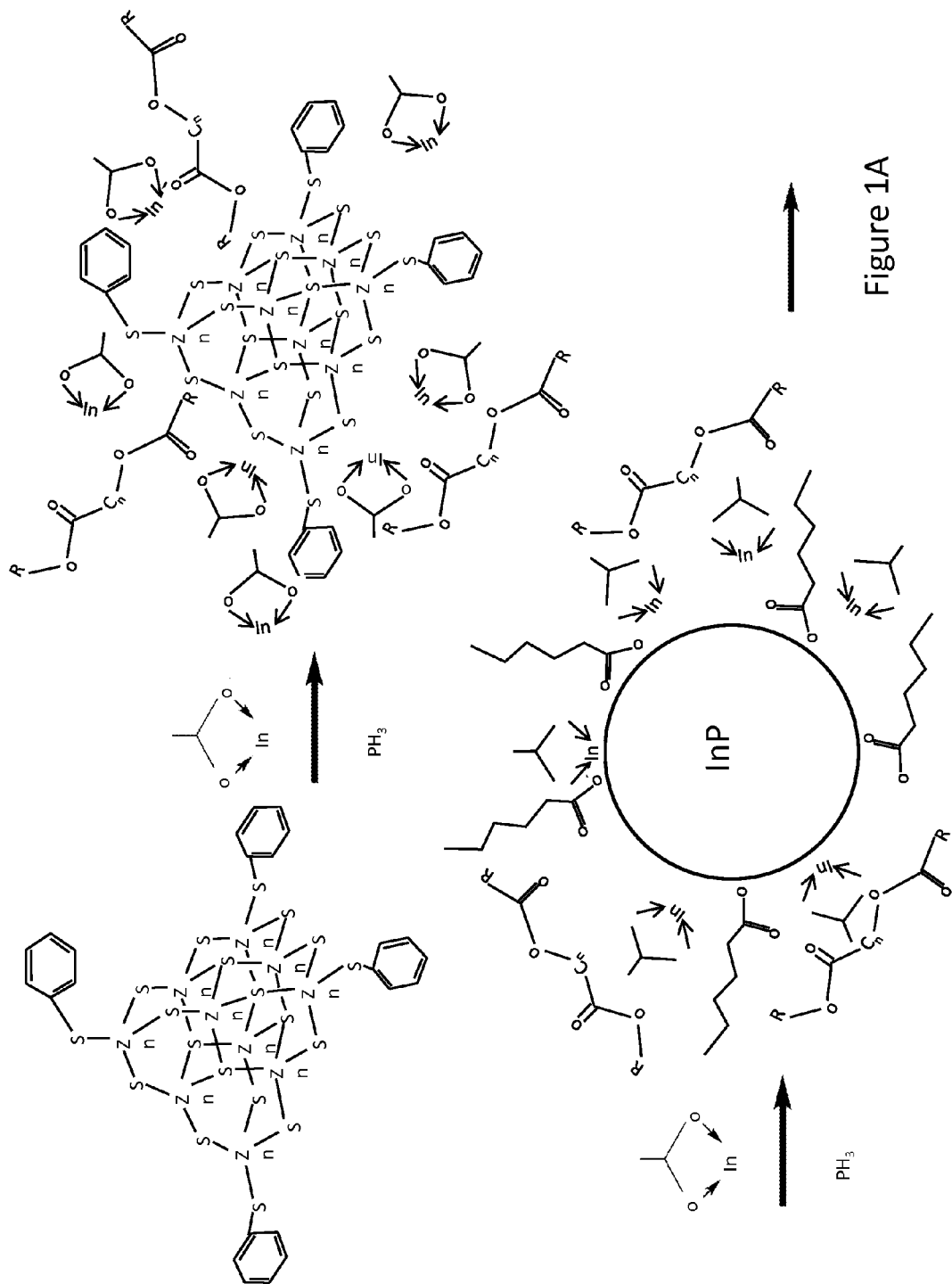
FIGS. 1A and 1B illustrates a process for making InP QDs.

As mentioned above, the present disclosure is directed to economically feasible processes for making quantum dots ("QDs"). As used herein, the terms QD, nanoparticle, and nanocrystal are used interchangeably. An advantage of the method disclosed herein is that it can be used to prepare QDs on commercial scales in a commercially feasible manner.

The QDs described herein have a core made of a semiconductor material. According to certain embodiments, the core semiconductor material is free of, or is essentially free of, cadmium. Examples of such QDs are based on III-V materials and/or alloys of III-V materials. Examples of such III-V materials include InP, GaP, AlP, and BP, as well as alloys of those materials with other elements, including, but not limited to, group IIA, IIB, IVA, and/or VIA elements. Unless otherwise stated, the terms "III-V materials," "InP," "GaP," "AlP," and "BP" refer both to pure semiconductor materials and their alloys with other elements.

The QDs may be core/shell QDs, as described in the Background section above. That is, there may be one or more additional semiconductor shells disposed upon the QD core. The shell layer(s) can be essentially any semiconductor material, such as, but not limited to, IIA-VIB materials, IIB-VIB materials, II-V materials, III-V materials, III-IV materials, III-VI materials, IV-VI materials, or materials incorporating a transition metal element or a d-block element. According to specific examples, the shell semiconductor material incorporates ions from group 12 of the periodic table, such as zinc ions anions from group 16 of the periodic table, such as sulfide ions, selenide ions or telluride ions. While the shell materials may incorporate cadmium, it is generally preferable that they do not, for the reasons described in the Background section.

The material used on any shell or subsequent numbers of shells grown onto the core III-V QD in most cases will be of a similar lattice type material to the core material i.e. have close lattice match to the core material so that it can be epitaxially grown on to the core, but is not necessarily restricted to materials of this compatibility. However, if the two materials, core and shell, are incompatible a buffer layer may be grown first on the outside of the core, between the semiconductor core and semiconductor shell. The material of any buffer layer or shell layer grown on to the core can include material comprising of:

IIA-VIB (2-16) material, incorporating a first element from group 2 of the periodic table and a second element from group 16 of the periodic table and also including ternary and quaternary materials and doped materials. QD material includes but is not restricted to: MgS, MgSe, MgTe, CaS, CaSe, CaTe, SrS, SrSe, SrTe.

IIB-VIB (12-16) material incorporating a first element from group 12 of the periodic table and a second element from group 16 of the periodic table and also including ternary and quaternary materials and doped materials. QD material includes but is not restricted to: ZnS, ZnSe, ZnTe, CdS, CdSe, CdTe, HgS, HgSe, HgTe.

II-V material incorporating a first element from group 12 of the periodic table and a second element from group 15 of the periodic table and also including ternary and quaternary materials and doped materials. QD material includes but is not restricted to: $Zn_3P_2$, $Zn_3As_2$, $Cd_3P_2$, $Cd_3As_2$, $Cd_3N_2$, $Zn_3N_2$.

III-V material incorporating a first element from group 13 of the periodic table and a second element from group 15 of the periodic table and also including ternary and quaternary materials and doped materials. QD material includes but is not restricted to: BP, AlP, AlAs, AlSb; GaN, GaP, GaAs, GaSb, InN, InP, InAs, InSb, MN, BN.

III-IV material incorporating a first element from group 13 of the periodic table and a second element from group 14 of the periodic table and also including ternary and quaternary materials and doped materials. QD material includes but is not restricted to: $B_4C$, $Al_4C_3$, $Ga_4C$.

III-VI material incorporating a first element from group 13 of the periodic table and a second element from group 16 of the periodic table and also including ternary and quaternary materials. QD material includes but is not restricted to: $Al_2S_3$, $Al_2Se_3$, $Al_2Te_3$, $Ga_2S_3$, $Ga_2Se_3$, $In_2S_3$, $In_2Se_3$, $Ga_2Te_3$, $In_2Te_3$.

IV-VI material incorporating a first element from group 14 of the periodic table and a second element from group 16 of the periodic table and also including ternary and quaternary materials and doped materials. QD material includes but is not restricted to: PbS, PbSe, PbTe, $Sb_2Te_3$, SnS, SnSe, SnTe.

QD material incorporating a first element from any group in the d-block of the periodic table, and a second element from group 16 of the periodic table, and optionally including any element from group 13 of the periodic table to form ternary and quaternary materials, and doped materials. QD material includes but is not restricted to: NiS, CrS, $CuInS_2$, $CuInSe_2$, $CuGaS_2$, $CuGaSe_2$, $Cu_2ZnSnS_4$.

The QDs described herein typically fall within the size range 2-100 nm. The shape of the QD is not restricted to a sphere and can take any desirable shape, for example, a rod, sphere, disk, tetrapod or star. The control of the shape of the QD can be achieved in the reaction particle growth process by the addition of a compound that will preferentially bind to a specific lattice plane of the growing particle and subsequently inhibit or slow particle growth in a specific direction. Non-limiting examples of compounds that can be added to achieve this effect include: phosphonic acids (n-tetradecylphosphonic acid, hexylphosphonic acid, 1-decanesulfonic acid, 12-hydroxydodecanoic acid, n-octadecylphosphonic acid).

It should be noted that distinct boundaries or transitions might exist between semiconductor materials of the QDs. In other words, the transition between the core and the first shell or between subsequent shell layers may be discernable based on chemical composition. Alternatively, significant alloying may occur between the core and the shell, between the first shell and the second shell, etc., such that the transition(s) between semiconductor materials are gradients rather than well-defined boundaries.

As described in the Background section above, it is generally advantageous that the outermost surface of the QD be capped with an organic capping agent to minimize non-radiative electron-hole combinations at defects or dangling bonds at the QD surface. The capping agent may be molecules of the solvent in which the QDs are formed. A number of different coordinating solvents can also act as capping or passivating agents, e.g. TOP, TOPO, HDA, or long chain organic acids such as myristic acid (tetradecanoic acid), long chain amines, or functionalised polyethylene glycol (PEG) chains, but are not restricted to these capping agents.

If a non-coordinating solvent, such as an alkane, terphenyl, Therminol™, etc. is used then it will usually be used in the presence of a further coordinating agent to act as a capping agent. Such capping agents are typically Lewis bases, including mono- or multi-dentate ligands of the type phosphines (trioctylphosphine, triphenolphosphine, t-butylphosphine), phosphine oxides (trioctylphosphine oxide), alkyl phosphonic acids, alkyl-amines (hexadecylamine, octylamine), aryl-amines, pyridines, thiols (octanethiol), a long chain fatty acid and thiophenes, but a wide range of other agents are available, such as oleic acid and organic polymers which form protective sheaths around the QDs. The capping agent can also possess functional groups that can be used as chemical linkage to other inorganic, organic or biological material. The capping agent can also consist of a coordinated ligand that processes a functional group that is polymerisable and can be used to form a polymer around the particle. The capping agent can be directly bonded to the outermost inorganic layer and can also possess a functional group, not bonded to the surface of the particle, that can be used to form a polymer around the particle, or for further reactions.

The methods described herein involve reacting phosphine with one or more additional semiconductor precursors to form the material for the QD core. Phosphine may be provided as a gas and bubbled directly into the reaction. Alternatively (or additionally) the phosphine may be generated in situ from a side-reaction using any suitable reagents for providing phosphine as a product. The phosphine may be pre-coordinated to a Lewis acid or base and added as a Lewis acid-base adduct to release $PH_3$ in situ.

Phosphines traditionally act as Lewis bases, however examples of phosphines behaving as Lewis acceptors have been reported, as reviewed by Burford and Ragogna (N. Burford, P. J. Ragogna, *J. Chem. Soc., Dalton Trans.*, 2002, 4307). By pre-coordinating $PH_3$ to a Lewis acid or base, the resulting Lewis acid-base adduct may provide a more soluble precursor than gaseous $PH_3$, and its addition to the reaction solution may be easier to control. Example adducts for pre-coordinating $PH_3$ include, but are not limited to trialkyl compounds of Group III elements, such as have been used for Metal-organic Chemical Vapour Deposition (MOCVD) of III-V semiconductors. See, e.g., H. M. Manasevit and W. I. Simpson, *J. Electrochem. Soc.* 1969, 116, 1725; *J. Electrochem Soc.* 1973, 120, 135; R. H. Moss, *J. Cryst. Growth* 1984, 68, 78; and D C. Bradley, H. Chudzynska, M. M. Faktor, D. M. Frigo, M. B. Hursthouse, B. Hussain and L. M. Smith, *Polyhedron* 1988, 7(14), 1289. Involatile boron containing adducts have been used as a safe storage system for phosphine and arsine. Pure phosphine or arsine can be liberated from such adducts by thermal cracking or displacement. See D C. Bradley, Dao-Hong, European patent 1991, EP0443739 A1.

Phosphine provides the phosphorus component of the III-V materials and/or alloys of III-V materials of the QD core. The other core components are provided by core semiconductor precursors, which will typically include a source of group III ions. The group III ions of the core semiconductor material may be derived from an organometallic compound, a coordination compound, an inorganic salt and/or an elemental source. Examples of group III precursors include group III-phosphines, group III-$(TMS)_3$, group III-alkyls, group III-aryls, group III-halides, group III-$(myrisate)_3$, group III-$(acetate)_3$, and group III-$(acetylacetonate)_3$.

As mentioned above, the III-V material of the core may be alloyed with other elements. Likewise, the III-V core may be part of a core/shell QD having one or more shell semiconductor materials selected from those groups or also including groups III and group V. The following discussion relates to precursors for the alloying elements (if present) and precursors for one or more subsequent shell.

Precursors Used for Inorganic Shell or Core Alloying Elements. For a compound core/shell semiconductor QD consisting of a III-V core and an $ME_n$ shell (where M and E are the elements in the shell or subsequent shell layer) a source for element M may be further added to the reaction and can consist of any E-containing species that has the ability to provide the growing particles with a source of E ions.

M Source. The precursor can be, but is not restricted to, an organometallic compound, an inorganic salt, a coordination compound or an elemental source. Examples for II-VI, III-V, III-VI or IV-V for the first element include, but are not restricted to:

Organometallic such as, but not restricted to, $MR_2$ where M=Mg, R=alky or aryl group ($Mg^tBu_2$); $MR_2$ where M=Zn, Cd, Te; R=alky or aryl group ($Me_2Zn$, $Et_2Zn$, $Me_2Cd$, $Et_2Cd$); $MR_3$ where M=Ga, In, Al, B; R=alky or aryl group [$AlR_3$, $GaR_3$, $InR_3$ (R=Me, Et, $^iPr$)].

Coordination compound such as a carbonate, but not restricted to, $MCO_3$ M=Ca, Sr, Ba, [magnesium carbonate hydroxide $(MgCO_3)_4Mg(OH)_2$]; $M(CO_3)_2$ M=Zn, Cd; $MCO_3$M=Pb; acetate $M(CH_3CO_2)_2$ M=Mg, Ca, Sr, Ba, Zn, Cd, Hg; $M_2(CO_3)_3$ M=B, Al, Ga, In; a β-diketonate or derivative thereof, such as acetylacetonate (2,4-pentanedionate) $M[CH_3C(O^-)\!\!=\!\!CHC(O)CH_3]_2$ M=Mg, Ca, Sr, Ba, Zn, Cd, Hg; $M[CH_3C(OH)\!\!=\!\!CHC(O)CH_3]_3$ M=B, Al, Ga, In; oxalate $SrC_2O_4$, $CaC_2O_4$, $BaC_2O_4$, $SnC_2O_4$.

Inorganic salt such as, but not restricted to, a oxides SrO, ZnO, CdO, $In_2O_3$, $Ga_2O_3$, $SnO_2$, $PbO_2$; nitrates $Mg(NO_3)_2$, $Ca(NO_3)_2$, $Sr(NO_3)_2$, $Ba(NO_3)_2$, $Cd(NO_3)_2$, $Zn(NO_3)_2$, $Hg(NO_3)_2$, $Al(NO_3)_3$, $In(NO_3)_3$, $Ga(NO_3)_3$, $Sn(NO_3)_4$, $Pb(NO_3)_2$.

Elemental sources, such as, but not restricted, to Mg, Ca, Sr, Ba, Zn, Cd, Hg, B, Al, Ga, In, Sn, Pb.

E Source. A source for element E may be further added to the reaction and can consist of any E-containing species that has the ability to provide the growing particles with a source of E ions. The precursor can include, but is not restricted to an organometallic compound, an inorganic salt, a coordination compound or an elemental source. Examples for element E in a II-VI, III-V, III-VI or IV-V semiconductor QD include, but are not restricted to:

Organometallics, such as, but not restricted to: $NR_3$, $PR_3$, $AsR_3$, $SbR_3$ (R=Me, Et, $^tBu$, $^iBu$, $Pr^i$, Ph etc.); $NHR_2$, $PHR_2$, $AsHR_2$, $SbHR_2$ (R=Me, Et, $^tBu$, $^iBu$, $Pr^i$, Ph etc.); $NH_2R$, $PH_2R$, $AsH_2R$, $SbH_2R_3$ (R=Me, Et, $^tBu$, $^iBu$, $Pr^i$, Ph etc.); $PH_3$, $AsH_3$; $M(NMe)_3$ M=P, Sb, As; dimethyldrazine ($Me_2NNH_2$); ethylazide (Et-NNN); hydrazine ($H_2NNH_2$); $Me_3SiN_3$.

$MR_2$ (M=S, Se Te; R=Me, Et, $^tBu$, $^iBu$ etc.); HMR (M=S, Se Te; R=Me, Et, $^tBu$, $^iBu$, $^iPr$, Ph etc.); thiourea S=C$(NH_2)_2$; selenourea Se=C$(NH_2)_2$. $Sn(CH_3)_4$, $Sn(C_4H_9)_4$, $Sn(CH_3)_2(OOCH_3)_2$.

Coordination compounds, such as, but not restricted to, a carbonate, $MCO_3$ M=P, bismuth subcarbonate $(BiO)_2CO_3$; $M(CO_3)_2$; acetate $M(CH_3CO)_2$ M=S, Se, Te; a β-diketonate or derivative thereof, such as acetylacetonate (2,4-pentanedionate) $[CH_3C(O)\!\!=\!\!CHC(O)CH_3]_3M$ M=Bi; $[CH_3C(O)\!\!=\!\!CHC(O)CH_3]_2M$ M=Sn, Pb; thiourea, selenourea $H_2NC(\!\!=\!\!Se)NH_2$.

Inorganic salts, such as, but not restricted to oxides $P_2O_3$, $As_2O_3$, $Sb_2O_3$, $Sb_2O_4$, $Sb_2O_5$, $Bi_2O_3$, $SO_2$, $SeO_2$, $TeO_2$, $Sn_2O$, PbO, $PbO_2$; nitrates $Bi(NO_3)_3$, $Sn(NO_3)_4$, $Pb(NO_3)_2$.

Elemental sources: Sn, Ge, N, P, As, Sb, Bi, S, Se, Te, Sn, Pb.

According to the disclosed methods, the QDs are formed in the presence of a molecular cluster compound. The term "molecular cluster," as used herein, refers to well-defined identical molecular entities. The term "molecular cluster" does not encompass ensembles of small QDs, which inherently lack the anonymous nature of molecular clusters. The synthesis of QDs will be discussed in more detail below, but it should be noted here that the molecular cluster is employed as a template to initiate particle growth. By using a molecular cluster there is no need for a high temperature nucleation step as in the conventional method of producing III-V-based QDs, which means large-scale synthesis is possible.

It is generally preferred, but not necessary, that the molecular cluster compound and the core semiconductor material have compatible crystal phases, which facilitates growth of said core semiconductor material on said molecular cluster compound. For example, the molecular cluster compound and the core semiconductor material may have the same crystal phase. In the Examples set out below, zinc sulfide-based molecular clusters are used to grow indium phosphide-based core semiconductor QDs.

According to certain embodiments, II-VI molecular clusters such as $[HNEt_3]_4[Zn_{10}S_4(SPh)_{16}]$ are used to seed the growth of the III-V QD materials and their alloys. This is partly because there are few known III-V molecular clusters, they are difficult to make, and are generally air and moisture sensitive. On the other hand, a large number of II-VI molecular clusters are known that can be made by simple procedures. Applicant has found that III-V QDs can be seeded on a number of II-VI molecular clusters and so it is now appreciated that a III-V molecular cluster is not required to grow a III-V QD.

While it may have been predicted that QDs incorporating a cluster of one type of material (i.e., a II-VI-based material) and a core of a different type of semiconductor material (i.e., a III-V-based material) grown on the cluster would exhibit poor quantum yields, it has surprisingly been observed that the resulting QDs exhibit relatively high quantum efficiency. Moreover, it has been determined that the quantum yields can be improved further by washing the surface of the core QDs with acid and/or growing one or more further layers of shell semiconductor material, such as a II-VI material (e.g. ZnS), on the core semiconductor material.

Type of Cluster Used for Seeding. As mentioned above, the clusters act as 'embryo-type' templates for the growth of QDs whereby other molecular precursors contribute ions to the growth process and thus clusters subsequently grow into particles. The molecular clusters can incorporate a first ion from group 12 of the periodic table and a second ion from group 16 of the periodic table. The group 12 ion may be selected from the group consisting of zinc, cadmium or mercury. The group 16 ion may be selected from the group consisting of sulfur, selenium and tellurium.

Examples of molecular clusters that can be used, but not restricted to, are:

IIB-VIB

[{(PPh$_3$)Hg}$_4$(SPh)$_6$]
(Ph$_4$P)$_2$[(SEt)$_5$(Br)(HgBr)$_4$]
(Ph$_4$P)$_2$[Hg$_4$(SEt)$_5$Br]
[Hg$_4$Te$_{12}$][N(CH$_2$CH$_2$Et)$_4$]$_4$
[RME'Bu]$_5$ where M=Zn, Cd, Hg; E=S, Se, Te; R=Me, Et, Ph
[X]$_4$[E$_4$M$_{10}$(SR)$_{16}$] where M=Zn, Cd, Hg; E=S, Se, Te, X=Me$_3$NH$^+$, Li$^+$, Et$_3$NH$^+$ [Cd$_{32}$S$_{14}$(SPh)$_{36}$].L; R=Me, Et, Ph
[Hg$_{10}$Se$_4$(SePh)(PPh$_2$″Pr)$_4$]
[Hg$_{32}$Se$_{14}$(SePh)$_{36}$]
[Cd$_{10}$Se$_4$(SePh)$_{12}$(PPr$_3$)$_4$]
[Cd$_{32}$Se$_{14}$(SePh)$_{36}$(PPh$_3$)$_4$]
[M$_4$(SPh)$_{12}$]$^+$[X]$_2^-$ where M=Zn, Cd, Hg; X=Me$_4$N$^+$, Li$^+$
[Zn(SEt)Et]$_{10}$
[MeMEiPr] where M=Zn, Cd, Hg; E=S, Se, Te
[RCdSR']$_5$ where R=O(ClO$_3$), R'=PPh$_3$, $^i$Pr
[Cd$_{10}$E$_4$(E'Ph)$_{12}$(PR$_3$)$_4$] where E=Te, Se, S and separately E'=Te, Se, S
[Cd$_8$Se(SePh)$_{12}$Cl$_4$]$^{2-}$
[M$_4$Te$_{12}$]$^{4-}$ where M=Cd, Hg
[Ph$_{12}$M$_{18}$Cd$_{10}$(PEt$_3$)$_3$] where M=Te, Se The molecular cluster to be used as the seeding agent can either be prefabricated or produced in situ prior to acting as a seeding agent. Some precursor may or may not be present at the beginning of the reaction process along with the molecular cluster, however, as the reaction proceeds and the temperature is increased, additional amounts of precursors can be added periodically to the reaction either dropwise as a solution, bubbled through as a gas, or as a solid.

During the course of the reaction, phosphine is added to the reaction solution to initiate growth of the III-V QDs. As mentioned above, phosphine gas may be bubbled through directly from a cylinder, generated in situ from a side-reaction using any suitable reagents, or pre-coordinated to a Lewis acid or base and added as a Lewis acid-base adduct to release PH$_3$ in situ. The total amount of phosphine and other precursors required to form the final desired yield of QDs can be added before QD growth has begun, or alternatively, the precursors can be added in stages throughout the reaction. These molecular sources may be periodically added to the reaction solution so as to keep the concentration of free ions to a minimum, whilst maintaining a concentration of free ions to inhibit both Ostwald's ripening and defocusing of QD size range from occurring. The conversion of the precursors to the material of the QDs can be conducted in any suitable solvent.

According to certain embodiments it is important to maintain the integrity of the molecules of the cluster compound. Consequently, when the cluster compound and QD precursor are introduced into the solvent the temperature of the solvent generally is sufficiently high to ensure satisfactory dissolution and mixing of the cluster compound (it is not necessary that the present compounds are fully dissolved, but desirable), but not so high as to disrupt the integrity of the cluster compound molecules. Once the cluster compound and precursor composition are sufficiently well dissolved in the solvent, the temperature of the solution thus formed may be raised to a temperature, or range of temperatures, which is/are sufficiently high to initiate QD growth but not so high as to damage the integrity of the cluster compound molecules. In some embodiments, as the temperature is increased, further quantities of precursor are added to the reaction by bubbling through phosphine gas, in a dropwise manner as a liquid, or as a solid. The temperature of the solution can then be maintained at this temperature or within this temperature range for as long as required to form QDs possessing the desired properties.

Because of the separation of particle nucleation and growth, the process enables a high degree of control in terms of particle size, which is controlled by the temperature of the reaction and concentrations of precursors present. Once the desired particle size is obtained, as established from UV and/or PL spectra of the reaction solution either by an in situ optical probe or from aliquots of the reaction solution, the mixture is left to anneal for a period of time being from 10 minutes to 144 hours, either at the same or a reduced temperature.

Further treatment of the QDs to form core/shell or core/multi shell particles may be undertaken. Core/shell particle preparation is undertaken either before or after QD isolation, whereby the QDs are isolated from the reaction and redissolved in new (clean) capping agent, either the same capping agent compound or a different capping agent compound, as this can result in better quality quantum dots. Shell semiconductor precursors, as described above, are added to the reaction mixture.

The shelling process may be repeated with the appropriate precursors until the desired core-multi shell material is formed. The QDs size and size distribution in an ensemble of particles is dependent on the growth time, temperature and concentrations of reactants in solution, with higher temperatures producing larger QDs.

EXAMPLES

All syntheses and manipulations were carried out under a dry oxygen-free nitrogen atmosphere using standard Schlenk and glove box techniques. All solvents were analytical grade and distilled from appropriate drying agents prior to use. All chemicals were analytical grade.

Figure 1B:
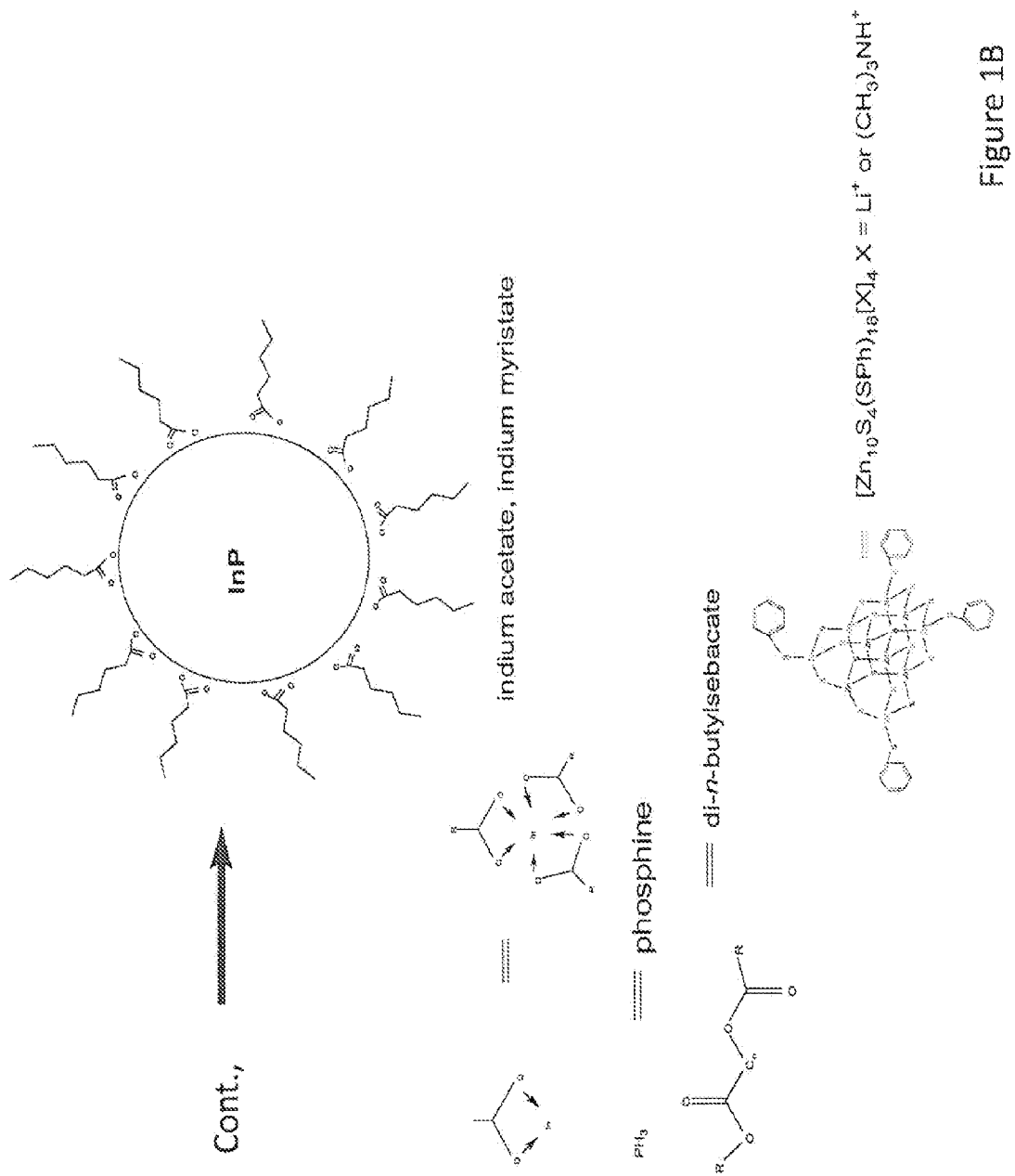

General Procedure. The general reaction mechanism is shown in FIGS. 1A and 1B. A II-VI cluster, such as [HNEt$_3$]$_4$[Zn$_{10}$S$_4$(SPh)$_{16}$], and small quantities of 'feedstock' precursors, i.e. a group III precursor such as indium myristate and a group V element precursor such as $PH_3$, are used as feedstock precursors and added to a solution containing a solvent and/or a capping agent, the temperature is then increased and the reaction stirred for a first period of time which results in the onset of III-V particle formation.

Further addition of both the feedstock precursors leads to a red shift of the UV emission maximum of the quantum dots, as monitored by an in situ UV probe. If further precursor is added at this stage there is no further red shift of the UV maximum, thus the particles do not grow anymore. However, when the temperature is increased (by 5-40° C.) the UV maximum is again red shifted. When more precursors are added to the reaction solution the UV maximum red shifts again. Therefore, this cycle of addition of precursor followed by incrementally increasing the reaction temperature can be repeated until the UV maximum peak is at the desired emission. The reaction may then be cooled to a lower temperature and allowed to anneal for a further period of time, after which III-V QDs incorporating II-VI clusters can be isolated. Alternatively, the QDs may be annealed without cooling.

Example 1

Figure 2:
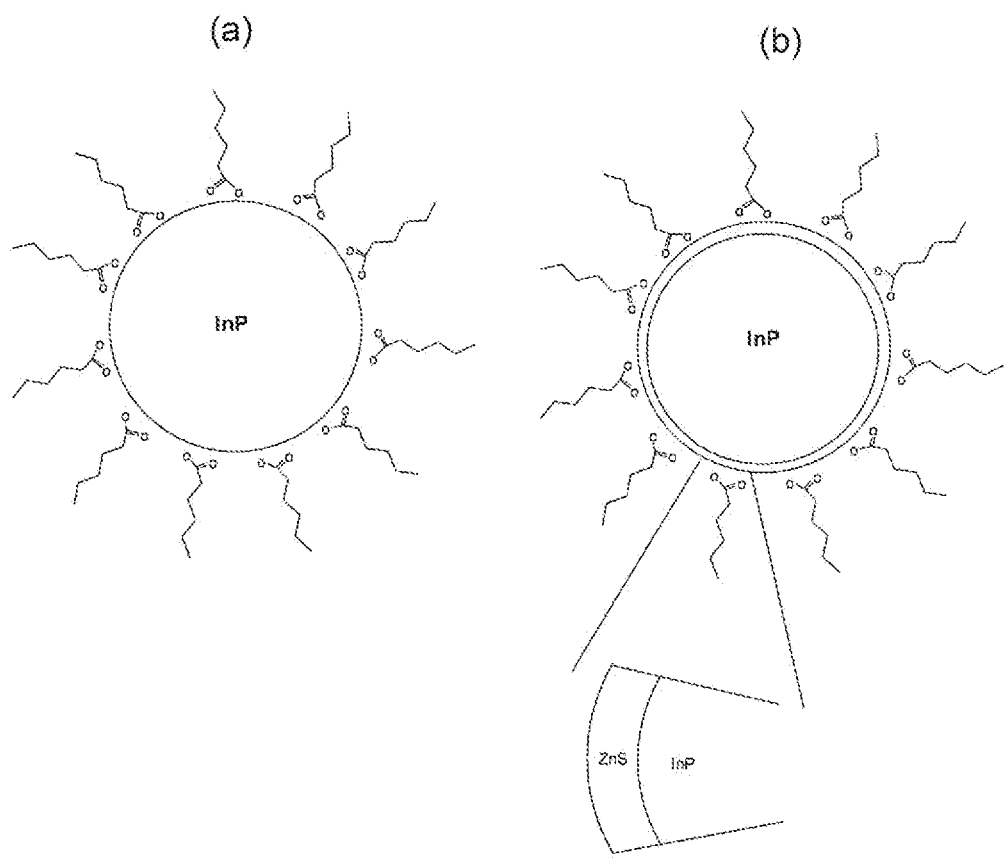
FIG. 2 illustrates QDs prepared using the disclosed process.

Preparation of InP-based QDs. 50 milliliters (mL) of Therminol 66®, 0.75 grams of myristic acid, and 5.87 grams of indium myristate at approximately 100° C. were placed in a round-bottomed three-necked flask, purged with $N_2$, and degassed under vacuum. Next, 1.35 g of ZnS cluster $[HNEt_3]_4[Zn_{10}S_4(SPh)_{16}]$ were added to the flask. Then $PH_3$ was added via a mass flow controller at a rate of 5 mL $min^{-1}$ for 10 minutes. The temperature was increased to 160° C. and a further amount of $PH_3$ was added via a mass flow controller at a rate of 5 mL $min^{-1}$ for 13.5 minutes. The temperature was increased to 195° C. and a further amount of $PH_3$ was added via a mass flow controller at a rate of 5 mL $min^{-1}$ for 18 minutes. This temperature was maintained for approximately 16 hours before the solution was cooled to room temperature. This procedure resulted in the formation of InP-based QDs on ZnS molecular clusters, as shown in FIG. 2($a$).

Example 2

Preparation of InP-based QDs. 50 mL of Therminol 66®, 0.75 g of myristic acid, and 5.87 g of indium myristate at approximately 100° C. were placed in a round-bottomed three-necked flask, purged with $N_2$, and degassed under vacuum. Next 1.35 g of ZnS cluster $[HNEt_3]_4[Zn_{10}S_4(SPh)_{16}]$ were added to the flask, which was then degassed under vacuum for 10-15 minutes, then purged with $N_2$. $PH_3$ was added via a dispersion tube at a rate of 5 mL $min^{-1}$ for 10 minutes; the dispersion tube was diluted with $N_2$ at a rate of 500 mL $min^{-1}$ The temperature was increased to 160° C. and a further amount of $PH_3$ was added via a dispersion tube, diluted with $N_2$ at a rate of 200 mL $min^{-1}$, at a rate of 5 mL $min^{-1}$ for 38.5 minutes. The temperature was increased to 195° C. and a further amount of $PH_3$ was added via a dispersion tube, diluted with $N_2$ at a rate of 100 mL $min^{-1}$, at a rate of 5 mL $min^{-1}$ for 18 minutes. This temperature was maintained for approximately 16 hours before the solution was cooled to room temperature. This procedure resulted in the formation of InP-based QDs (UV-vis$_{abs}$=454 nm).

Example 3

Preparation of InP-based QDs. 50 mL of Therminol 66®, 0.75 g of myristic acid, and 5.87 g of indium myristate at approximately 100° C. were placed in a round-bottomed three-necked flask, purged with $N_2$, and degassed under vacuum. Next 1.35 g of ZnS cluster $[HNEt_3]_4[Zn_{10}S_4(SPh)_{16}]$ were added to the flask, which was then degassed under vacuum for 10-15 minutes, then purged with $N_2$. $PH_3$ was added via a dispersion tube at a rate of 5 mL $min^{-1}$ for 10 minutes; the dispersion tube was diluted with $N_2$ at a rate of 200 mL $min^{-1}$ The temperature was increased to 160° C. and a further amount of $PH_3$ was added via a dispersion tube, diluted with $N_2$ at a rate of 200 mL $min^{-1}$, at a rate of 5 mL $min^{-1}$ for 38.5 minutes. The temperature was increased to 195° C. and a further amount of $PH_3$ was added via a dispersion tube, diluted with $N_2$ at a rate of 200 mL $min^{-1}$, at a rate of 5 mL $min^{-1}$ for 18 minutes. This temperature was maintained for approximately 64 hours before the solution was cooled to room temperature. This procedure resulted in the formation of InP-based QDs (UV-vis$_{abs}$=451 nm).

Example 4

Preparation of InP-based QDs. 50 mL of Therminol 66®, 0.75 g of myristic acid, and 5.87 g of indium myristate at approximately 100° C. were placed in a round-bottomed three-necked flask, purged with $N_2$, and degassed under vacuum. Next 1.35 g of ZnS cluster $[HNEt_3]_4[Zn_{10}S_4(SPh)_{16}]$ were added to the flask, which was then degassed under vacuum for 10-15 minutes, then purged with $N_2$. $PH_3$ was added via a dispersion tube at a rate of 5 mL $min^{-1}$ for 10 minutes; the dispersion tube was diluted with $N_2$ at a rate of 50 mL $min^{-1}$. The temperature was increased to 160° C. and a further amount of $PH_3$ was added via a dispersion tube, diluted with $N_2$ at a rate of 20 mL $min^{-1}$, at a rate of 5 mL $min^{-1}$ for 38.5 minutes. The temperature was increased to 195° C. and a further amount of $PH_3$ was added via a dispersion tube, diluted with $N_2$ at a rate of 20 mL $min^{-1}$, at a rate of 5 mL $min^{-1}$ for 18 minutes. This temperature was maintained for approximately 136 hours before the solution was cooled to room temperature. This procedure resulted in the formation of InP QDs on ZnS molecular clusters (UV-vis$_{abs}$=458 nm). The resulting InP-based QDs were washed in acid.

Growth of a ZnS Shell. The InP-based cores were re-dispersed in solution and shelled with ZnS to further improve their stability and quantum yield. The procedure resulted in InP/ZnS core-shell QDs, as illustrated in FIG. 2($b$).

Example 5

Large Scale Preparation of QDs Using an Autoclave. The synthesis was conducted in a 20 L autoclave. 4 L of Therminol 66®, 60.5 g of myristic acid, 469.6 g of indium myristate and 118.8 g of ZnS cluster $[HNEt_3]_4[Zn_{10}S_4(SPh)_{16}]$ were degassed under vacuum at 110° C., purged three times with $N_2$. At 80° C. 7.168 L of $PH_3$ were added at a rate of 750 mL $min^{-1}$ The temperature was increased to 195° C. (3 h) and volatiles were then removed (1.5 h). The solution was annealed for 120 hours at 400 rpm, before cooling to room temperature. This procedure resulted in the formation of zinc and sulphur-doped indium phosphide QDs on a II-VI cluster.

Example 6

Preparation of QDs in a Two-stage Reaction Using Bistrimethylsilyl sulfide (TMS-S) in an Autoclave. The synthesis was conducted in a 1.3 L autoclave. 250 mL of Therminol 66®, 3.75 g of myristic acid, 29.35 g of indium myristate, 1.84 g of $Zn(OAc)_2$, 1.48 g of $Mg(St)_2$ and 7.76 g of ZnS cluster $[HNEt_3]_4[Zn_{10}S_4(SPh)_{16}]$ were degassed under vacuum for 1 hour at 100° C., purged three times with $N_2$, 1.43 mL of TMS-S was added. At 60° C. 560 mL of $PH_3$ were added at a rate of 25 mL min$^{-1}$ The temperature was increased to 210° C. and the solution was annealed for 20 hours, before cooling to 100° C. At this temperature 0.71 mL of TMS-S was added followed by a further 280 mL of $PH_3$ at a rate of 25 mL min$^{-1}$ before the temperature was returned to 210° C. The solution was annealed for a further 4 hours at 400 rpm, before cooling to room temperature. This procedure resulted in the formation of zinc and sulphur-doped indium phosphide QDs on a II-VI cluster.

We claim:

1. A process of preparing a quantum dot (QD) nanoparticle, the process comprising:
    forming a core semiconductor material on the molecular cluster compound $[HNEt_3]_4[Zn_{10}S_4(SPh)_{16}]$ by reacting one or more semiconductor precursors with hydrogen phosphide in the presence of the molecular cluster compound, wherein the core semiconductor material comprises phosphorus ions and one or more counter ions provided by the semiconductor precursor.

2. The process of claim 1, wherein the core semiconductor material is a III-V semiconductor material.

3. The process of claim 1, wherein the semiconductor material comprises In, Ga, Al, or B.

4. The process of claim 3, wherein the semiconductor material further comprises one or more group IIA, IIB, IVA, or VIA elements.

5. The process of claim 1, wherein the one or more semiconductor precursors is a group III-phosphine, group III-(TMS)$_3$, group III-alkyl, group III-aryl, group III halide, group III-(myristate)$_3$, group III-(acetate)$_3$, or group III-(acetylacetonate)$_3$.

6. The process of claim 1, wherein reacting comprises heating a solvent containing the one or more semiconductor precursors, the hydrogen phosphide, and the molecular cluster at a first temperature.

7. The process of claim 6, further comprising heating the solvent to a second temperature.

8. The process of claim 1, wherein the reacting comprises providing gaseous hydrogen phosphide in a solvent containing the one or more semiconductor precursors and the molecular cluster.

9. The process of claim 1, wherein reacting comprises heating an adduct of hydrogen phosphide in a solvent containing the one or more semiconductor precursors and the molecular cluster.

10. The process of claim 1 wherein reacting comprises heating a metal phosphide or a Lewis acid-base adduct of hydrogen phosphide in a solvent containing the one or more semiconductor precursors and the molecular cluster to generate hydrogen phosphide in situ.

11. The process of claim 10, wherein the metal phosphide is $Na_3P$, $Ca_3P$, $Zn_3P$ or AlP.

12. The process of claim 1, further comprising binding a capping agent to the surface of the core semiconductor material.

13. The process of claim 1, further comprising forming a second semiconductor material on the surface of the first semiconductor material.

14. The process of claim 13, wherein the second semiconductor material is a II-VI semiconductor material.

15. The process of claim 13, wherein the second semiconductor material is ZnS.

* * * * *